US006956439B1

(12) United States Patent
Devnath

(10) Patent No.: US 6,956,439 B1
(45) Date of Patent: Oct. 18, 2005

(54) TRANSIMPEDANCE AMPLIFIER WITH CONTROLLABLE NOISE REDUCTION

(75) Inventor: Varadarajan Devnath, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 45 days.

(21) Appl. No.: 10/735,364

(22) Filed: Dec. 12, 2003

(51) Int. Cl.[7] .............................. H03F 3/08; H03F 3/45
(52) U.S. Cl. ...................................... 330/308; 330/259
(58) Field of Search ................... 250/214 A; 327/307; 330/9, 11, 85, 86, 308, 259

(56) References Cited

U.S. PATENT DOCUMENTS

| 6,774,728 B2 * | 8/2004 | Seetharaman et al. ...... 330/308 |
| 6,784,750 B2 * | 8/2004 | Chiou et al. ................ 330/308 |

* cited by examiner

*Primary Examiner*—Steven J. Mottola
(74) *Attorney, Agent, or Firm*—Vedder Price Kaufman & Kammholz, P.C.

(57) ABSTRACT

A transimpedance amplifier with controllable noise reduction in which DC offsets due to the input signal are tolerated during reception of low input signals by reducing, e.g., terminating, a compensation current to remove a dominant source of thermal noise, but compensated during reception of higher input signals where the effects of DC offsets are more dominant.

27 Claims, 2 Drawing Sheets

TRANSIMPEDANCE AMPLIFIER WITH CONTROLLABLE NOISE REDUCTION

BACKGROUND OF THE INVENTION

1. Field of the Invention

The present invention relates to amplifiers for amplifying signals having low magnitudes, and in particular, to transimpedance amplifiers used for amplifying signals having low magnitudes and containing DC offsets.

2. Description of the Related Art

Optical receivers responsible for receiving and amplifying data signals generated by optical signal systems typically use transimpedance amplifiers to receive and amplify the current based signal provided by a photodiode that receives the actual optical signal transmission. Such signals typically include a DC component, which often requires compensation so as to prevent biasing problems within the amplifier.

Referring to FIG. 1, a conventional transimpedance amplifier circuit for performing this function includes a gain stage in the form of an amplifier A1 (e.g., an operational amplifier) with a feedback resistor R2 between the input 3 and output 5 terminals. Also connected to the input terminal 3 is a current source I1 which provides a compensation circuit Ic (discussed in more detail below). The output signal voltage Vout also drives a lowpass filter circuit in the form of a serially connected resistance R1 and capacitance C1. The voltage V1 (which is the DC component of the output signal Vout) across the capacitor C1 is compared in a voltage comparison circuit A2 (e.g., voltage comparator) with a reference voltage Vref. The resulting signal V2 from this voltage comparison circuit A2 controls the current source I1, thereby controlling the compensation current Ic.

The photodiode D1 provides a signal current Is to the input node mutually connecting the current source I1, feedback resistor R2 and amplifier input terminal 3. When no light 1 is impinging upon the photodiode D1, the diode current Is is zero. During impingement of light 1 upon the photodiode D1, the diode current Is is non-zero and has a value determined by the responsivity of the photodiode and the input light power. If the incoming light signal 1 represents a data signal having a substantially equal number of ones and zeros, then the average photodiode current Isa will be equal to one-half of the peak photodiode current Is1 occurring during reception of a signal corresponding to a logical 1 (Isa=Is½). This average Isa current flows through the feedback resistor R2 of the transimpedance amplifier 4, thereby producing a potential difference between the DC bias points of the input terminal 3 and output terminal 5 of the amplifier A1. Accordingly, the DC bias point of the amplifier output terminal 5 is now dependent upon, i.e., varies with, the magnitude of the incoming signal, i.e., photodiode current Is, thereby making it difficult to maintain the DC biasing of the amplifier A1 for maximum dynamic range.

The conventional solution for this has been to provide the variable current source I1 at the input terminal 3 of the amplifier A1. The compensation current Ic provided by this current source I1 removes the DC component of the photodiode current Is. This is achieved by comparing the DC component V1 of the output signal voltage Vout (by lowpass filtering the output signal voltage Vout) with the reference Vref. If the DC output signal component V1 differs from the desired DC bias level, as represented by the reference voltage Vref, such voltage difference is caused by the DC component of the photodiode current Is flowing through the feedback resistor R2. Accordingly, the output signal V2 from the voltage comparison circuit A2 controls the current source I1 such that the compensation current Ic compensates for, i.e., removes, the DC component of the photodiode current Is at the amplifier input terminal 3, thereby causing the DC level at the amplifier output terminal 5 to return to and remain at the desired biasing point.

The conventional approach, however, is less than satisfactory for low values of photodiode current Is. As is well known, the current source I1 introduces thermal noise at the input node. The noise current resulting from such thermal noise is approximately equal to 4 $\alpha$KTGm for metal oxide semiconductor devices (where $\alpha$ is a technology-dependent MOSFET parameter which is typically approximately ⅔, K is Boltzmann's constant, T is temperature in degrees Kelvin, Gm is the transconductance of the current source I1) and 2 QIc for bipolar junction transistors (where Q is the charge of an electron ($1.6 \times 10^{-19}$) and Ic is the compensation current). In low signal noise applications, i.e., where the photodiode current Is contains little signal noise, this thermal noise is the dominant noise source and degrades the signal-to-noise ratio (SNR), thereby causing an increased bit error rate (BER).

SUMMARY OF THE INVENTION

In accordance with the presently claimed invention, a transimpedance amplifier with controllable noise reduction is provided in which DC offsets due to the input signal are tolerated during reception of low input signals by reducing, e.g., terminating, a compensation current to remove a dominant source of thermal noise, but compensated during reception of higher input signals where the effects of DC offsets are more dominant.

In accordance with one embodiment of the presently claimed invention, a transimpedance amplifier with controllable noise reduction includes amplifier circuitry and control circuitry. The amplifier circuitry includes input and output terminals, and is responsive to reception of an input signal and a compensation signal via the input terminal by providing an output signal via the output terminal, wherein: the input signal includes an AC component and a DC component; the compensation signal includes a DC component inverse in polarity to the input signal DC component; and the output signal includes an AC component corresponding to the input signal AC component, and a DC component comprising a sum of first and second DC subcomponents, wherein the first DC subcomponent corresponds to the input signal DC component. The control circuitry is coupled to the amplifier circuitry input and output terminals, and is responsive to reception of the output signal DC component and a reference signal including a DC component by providing the compensation signal, wherein: the reference signal DC component comprises a sum of third and fourth DC subcomponents; the third DC subcomponent corresponds to the second DC subcomponent; and the compensation signal DC component corresponds to a difference between the first and fourth DC subcomponents.

In accordance with another embodiment of the presently claimed invention, a transimpedance amplifier with controllable noise reduction includes amplifier means and controller means. The amplifier means is for receiving an input signal and a compensation signal and in response thereto generating an output signal, wherein: the input signal includes an AC component and a DC component; the compensation signal includes a DC component inverse in polarity to the input signal DC component; and the output signal includes an AC component corresponding to the input signal AC component, and a DC component comprising a sum of first and second DC subcomponents, wherein the first DC subcomponent corresponds to the input signal DC component. The controller means is for receiving the output signal DC component and a reference signal including a DC component and in response thereto generating the compensation signal, wherein: the reference signal DC component comprises a sum of third and fourth DC subcomponents; the third DC subcomponent corresponds to the second DC subcomponent; and the compensation signal DC component corresponds to a difference between the first and fourth DC subcomponents.

In accordance with another embodiment of the presently claimed invention, a transimpedance amplifier with controllable noise reduction includes input, output and reference terminals, amplifier circuitry and signal generator circuitry. The input terminal is to convey an input signal and a compensation signal, wherein: the input signal includes an AC component and a DC component; and the compensation signal includes a DC component inverse in polarity to the input signal DC component. The output terminal is to convey an output signal which includes an AC component corresponding to the input signal AC component, and a DC component comprising a sum of first and second DC subcomponents, wherein the first DC subcomponent corresponds to the input signal DC component. The reference terminal is to convey a reference signal including a DC component corresponding to a sum of the second DC subcomponent and a DC offset. First amplifier circuitry is coupled to the input and output terminals, and is responsive to reception of the input and compensation signals by providing the output signal. Second amplifier circuitry is coupled to the output and reference terminals, and is responsive to reception of the output signal DC component and the reference signal by providing a control signal with a value related to a difference between the first DC subcomponent and the DC offset. The signal generator circuitry is coupled to the input terminal and the second amplifier circuitry, and is responsive to reception of the control signal by providing the compensation signal.

In accordance with another embodiment of the presently claimed invention, a transimpedance amplifier with controllable noise reduction includes amplifier means and signal generator means. First amplifier means is for receiving an input signal and a compensation signal and in response thereto generating an output signal, wherein: the input signal includes an AC component and a DC component; the compensation signal includes a DC component inverse in polarity to the input signal DC component; the output signal includes an AC component corresponding to the input signal AC component, and a DC component comprising a sum of first and second DC subcomponents; and the first DC subcomponent corresponds to the input signal DC component. Second amplifier means is for receiving the output signal DC component and a reference signal and in response thereto generating a control signal, wherein: the reference signal includes a DC component corresponding to a sum of the second DC subcomponent and a DC offset; and the control signal has a value related to a difference between the first DC subcomponent and the DC offset. The signal generator means is for receiving the control signal and in response thereto generating the compensation signal.

In accordance with another embodiment of the presently claimed invention, a transimpedance amplifier with controllable noise reduction includes input, output and reference terminals, amplifier circuitry and signal generator circuitry. The input terminal is to convey an input signal and a compensation signal, wherein: the input signal includes an AC component and a DC component; and the compensation signal includes a DC component inverse in polarity to the input signal DC component. The output terminal is to convey an output signal which includes an AC component corresponding to the input signal AC component, and a DC component comprising a sum of first and second DC subcomponents, wherein the first DC subcomponent corresponds to the input signal DC component. The reference terminal is to convey a reference signal including a DC component corresponding to a sum of the second DC subcomponent and a DC offset. First amplifier circuitry is coupled to the input and output terminals, and is responsive to reception of the input and compensation signals by providing the output signal. Second amplifier circuitry is coupled to the output and reference terminals, and is responsive to reception of the output signal DC component and the reference signal by providing a control signal. The signal generator circuitry is coupled to the input terminal and the second amplifier circuitry, and is responsive to reception of the control signal by providing the compensation signal, wherein the compensation signal DC component corresponds to a difference between the first DC subcomponent and the DC offset.

In accordance with another embodiment of the presently claimed invention, a transimpedance amplifier with controllable noise reduction includes amplifier means and signal generator means. First amplifier means is for receiving an input signal and a compensation signal and in response thereto generating an output signal, wherein: the input signal includes an AC component and a DC component; the compensation signal includes a DC component inverse in polarity to the input signal DC component; the output signal includes an AC component corresponding to the input signal AC component, and a DC component comprising a sum of first and second DC subcomponents; and the first DC subcomponent corresponds to the input signal DC component. Second amplifier means is for receiving the output signal DC component and a reference signal and in response thereto generating a control signal, wherein the reference signal includes a DC component corresponding to a sum of the second DC subcomponent and a DC offset. The signal generator means is for receiving the control signal and in response thereto generating the compensation signal, wherein the compensation signal DC component corresponds to a difference between the first DC subcomponent and the DC offset.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
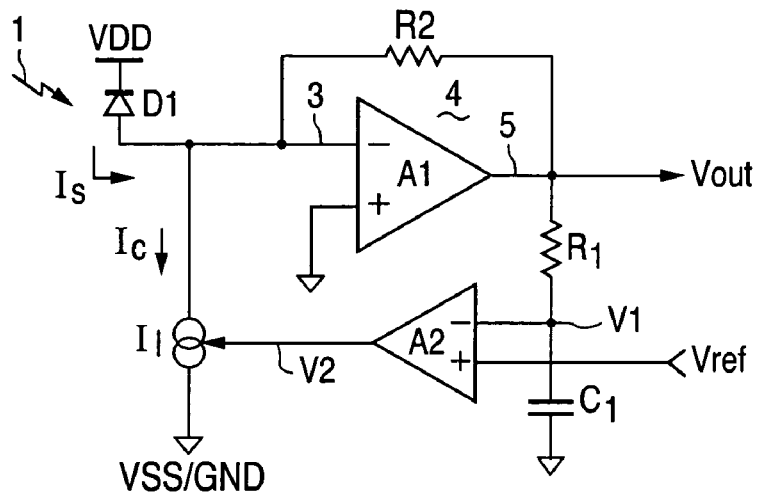
FIG. 1 is a circuit schematic of a conventional transimpedance amplifier circuit for input signals having low magnitudes.
Figure 2:
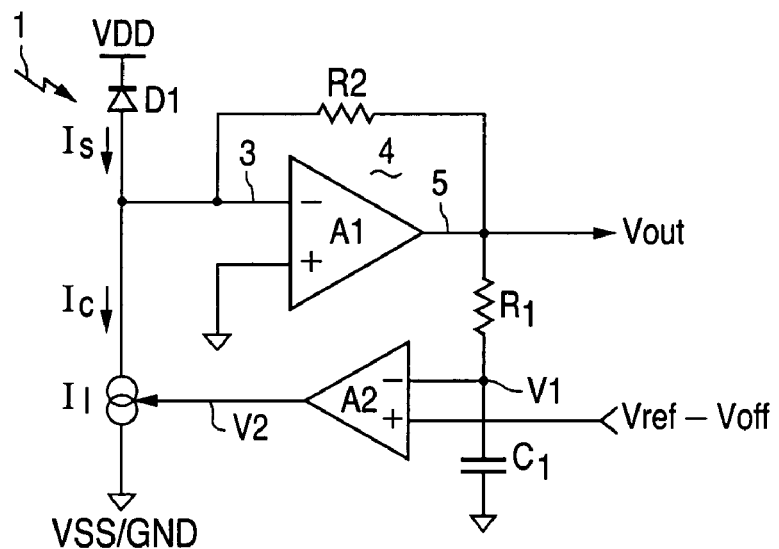
FIG. 2 is a circuit schematic of a transimpedance amplifier with controllable noise reduction in accordance with one embodiment of the presently claimed invention.

Referring to FIG. 2, a transimpedance amplifier with controllable noise reduction in accordance with one embodiment of the presently claimed invention includes a transimpedance amplifier 4, voltage comparison circuit A2 and current source I1, as discussed above, but provides for comparison of the DC component V1 of the output signal voltage Vout with a different threshold voltage which is a difference Vref−Voff between the reference voltage Vref (corresponding to the desired DC bias point for the amplifier output terminal 5) and an offset voltage Voff.

The offset voltage Voff is ideally selected to be the minimum of: the maximum tolerable signal excursion, i.e., peak magnitude of the AC component, of the output voltage Vout at the amplifier output terminal 5; and the minimum voltage Vr2min across the feedback resistor R2 at which the value of the photodiode current Is is large enough to achieve the desired BER notwithstanding thermal noise due to the compensation current Ic. Preferably, the amplifier A1 is designed to have sufficient gain such that such a minimum voltage Vr2min across the feedback resistor R2 is less than the maximum tolerable signal excursion at the amplifier output terminal 5. Accordingly, the offset voltage Voff is set equal to such minimum feedback resistor voltage Vr2min.

At low signal amplitudes, i.e., where the incoming photodiode current Is produces a voltage Vr2 across the feedback resistor R2 which is less than the minimum feedback resistor voltage Vr2min discussed above, the DC voltage Vr2 across the feedback resistor R2 is less than the offset voltage Voff. Hence, with this voltage Vr2 summed with the nominal DC biasing component at the amplifier output terminal 5, the total DC component V1 of the output signal voltage Vout is less than the threshold voltage of Vref−Voff. Accordingly, the output V2 of the voltage comparison circuit A2 goes low and the current source I1 is turned off. Hence, with no compensation current Ic drawn from the input node, no thermal noise is added by the current source I1.

At larger amplitudes where the DC component of the photodiode current Is produces a voltage Vr2 across the feedback resistor R2 which is greater than the minimum feedback resistor voltage Vr2min discussed above, the DC voltage Vr2 across the feedback resistor R2 is greater than the offset voltage Voff. As a result, the DC component V1 of the output voltage Vout at the amplifier output terminal 5 is greater than the threshold voltage of Vref−Voff. Accordingly, the output V2 of the voltage comparison circuit A2 goes high, thereby turning on the current source I1, which provides the compensation current Ic to remove the dc component of the photodiode current Is from the input node. This compensation current Ic is preferably equal to the difference between the actual DC component of the present photodiode current Is and the value of the DC component of the photodiode current Is corresponding to the minimum feedback resistor voltage Vr2min discussed above.

Figure 2A:
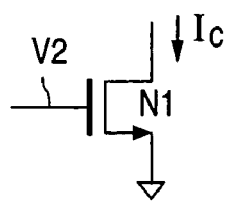
FIG. 2A is a schematic diagram of one possible embodiment of the current source of FIG. 2.

Referring to FIG. 2A, one example of an implementation of the current source I1 in the circuit of FIG. 2 is an N-type metal oxide semiconductor field effect transistor (MOSFET) with its gate terminal driven by the control voltage V2 and its drain terminal providing the compensation current Ic.

Figure 3:
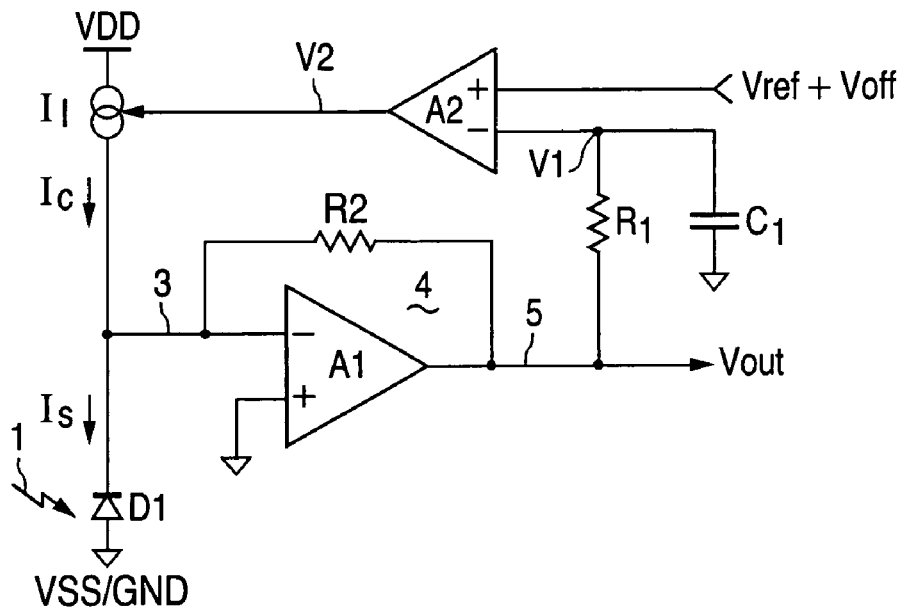
FIG. 3 is a circuit schematic of a transimpedance amplifier with controllable noise reduction in accordance with another embodiment of the presently claimed invention.
Figure 3A:
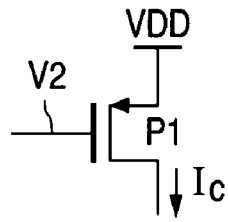
FIG. 3A is a schematic diagram of one possible embodiment of the current source of FIG. 3.

Referring to FIG. 3, a transimpedance amplifier with controllable noise reduction in accordance with an alternative embodiment of the presently claimed invention is similar to the circuit of FIG. 2, but receives its photodiode current Is from a grounded photodiode D1 and uses the current source I1 to source rather than sink the compensation current Ic at the input node. Operation of this circuit is in conformance with that discussed above for the circuit of FIG. 2.

Referring to FIG. 3, one example implementation of the current source I1 for the circuit of FIG. 3 is a P-type MOSFET with its gate terminal driven by the control voltage V2 and its drain terminal providing the compensation current Ic.

Figure 4:
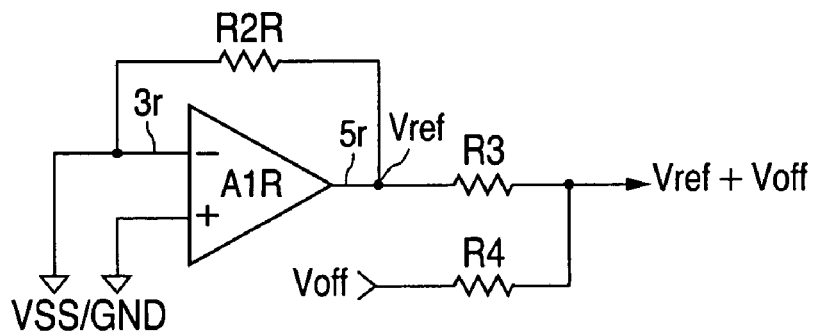
FIG. 4 is a circuit schematic of a replica voltage generator suitable for use with the circuits of FIGS. 2 and 3.

Referring to FIG. 4, the threshold voltage of Vref+Voff can be generated using a replica biasing voltage generator as shown. A replica amplifier A1r, which is designed to be a replica of the amplifier A1 (FIGS. 2 and 3) has its differential input terminals both connected to the circuit reference terminal VSS/GND so as to replicate a zero input signal condition. Similarly, a replica feedback resistor R2r is connected to the input 3r and output 5r terminals. The resulting output voltage Vref is then summed with the offset voltage Voff (which can be generated in virtually any manner) to produce the threshold voltage of Vref+Voff. The isolation resistors R3, R4 merely provide isolation between the sources of the two voltage components Vref, Voff and the voltage comparison circuit A2 (FIGS. 2 and 3).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a transimpedance amplifier with controllable noise reduction, comprising:
    amplifier circuitry including input and output terminals, and responsive to reception of an input signal and a compensation signal via said input terminal by providing an output signal via said output terminal, wherein said input signal includes an AC component and a DC component, said compensation signal includes a DC component inverse in polarity to said input signal DC component, and said output signal includes an AC component corresponding to said input signal AC component, and a DC component comprising a sum of first and second DC subcomponents, wherein said first DC subcomponent corresponds to said input signal DC component; and control circuitry coupled to said amplifier circuitry input and output terminals, and responsive to reception of said output signal DC component and a reference signal including a DC component by providing said compensation signal, wherein said reference signal DC component comprises a sum of third and fourth DC subcomponents, said third DC subcomponent corresponds to said second DC subcomponent, and said compensation signal DC component corresponds to a difference between said first and fourth DC subcomponents.

2. The apparatus of claim 1, wherein said amplifier circuitry comprises a transimpedance amplifier.

3. The apparatus of claim 1, wherein said amplifier circuitry comprises a differential amplifier and resistive circuitry coupled between said input and output terminals.

4. The apparatus of claim 1, wherein said control circuitry comprises signal comparison circuitry responsive to a comparison of said output signal DC component and said reference signal DC component by providing a control signal.

5. The apparatus of claim 4, wherein said control circuitry further comprises current source circuitry responsive to said control signal by providing a current as said compensation signal.

6. The apparatus of claim 4, wherein said control signal has a value related to said difference between said first and fourth DC subcomponents.

7. The apparatus of claim 1, wherein said fourth DC subcomponent corresponds to a minimum one of a plurality of values comprising a predetermined value related to said first DC subcomponent and a predetermined value related to said output signal AC component.

8. The apparatus of claim 1, wherein said compensation signal DC component has an approximately zero value when said input signal DC component has a magnitude less than a predetermined value.

9. An apparatus including a transimpedance amplifier with controllable noise reduction, comprising:

amplifier means for receiving an input signal and a compensation signal and in response thereto generating an output signal, wherein said input signal includes an AC component and a DC component, said compensation signal includes a DC component inverse in polarity to said input signal DC component, and said output signal includes an AC component corresponding to said input signal AC component, and a DC component comprising a sum of first and second DC subcomponents, wherein said first DC subcomponent corresponds to said input signal DC component; and controller means for receiving said output signal DC component and a reference signal including a DC component and in response thereto generating said compensation signal, wherein said reference signal DC component comprises a sum of third and fourth DC subcomponents, said third DC subcomponent corresponds to said second DC subcomponent, and said compensation signal DC component corresponds to a difference between said first and fourth DC subcomponents.

10. An apparatus including a transimpedance amplifier with controllable noise reduction, comprising:

an input terminal to convey an input signal and a compensation signal, wherein said input signal includes an AC component and a DC component, and said compensation signal includes a DC component inverse in polarity to said input signal DC component;

an output terminal to convey an output signal which includes an AC component corresponding to said input signal AC component, and a DC component comprising a sum of first and second DC subcomponents, wherein said first DC subcomponent corresponds to said input signal DC component;

a reference terminal to convey a reference signal including a DC component corresponding to a sum of said second DC subcomponent and a DC offset;

first amplifier circuitry coupled to said input and output terminals, and responsive to reception of said input and compensation signals by providing said output signal;

second amplifier circuitry coupled to said output and reference terminals, and responsive to reception of said output signal DC component and said reference signal by providing a control signal with a value related to a difference between said first DC subcomponent and said DC offset; and signal generator circuitry coupled to said input terminal and said second amplifier circuitry, and responsive to reception of said control signal by providing said compensation signal.

11. The apparatus of claim 10, wherein said first amplifier circuitry comprises a transimpedance amplifier.

12. The apparatus of claim 10, wherein said first amplifier circuitry comprises a differential amplifier and resistive circuitry coupled between said input and output terminals.

13. The apparatus of claim 10, wherein said second amplifier circuitry comprises signal comparison circuitry responsive to a comparison of said output signal DC component and said reference signal DC component by providing said control signal.

14. The apparatus of claim 10, wherein said signal generator circuitry comprises current source circuitry responsive to said control signal by providing a current as said compensation signal.

15. The apparatus of claim 10, wherein said compensation signal DC component corresponds to a difference between said first DC subcomponent and said DC offset.

16. The apparatus of claim 10, wherein said DC offset corresponds to a minimum one of a plurality of values comprising a predetermined value related to said first DC subcompoennt and a predetermined value related to said output signal AC component.

17. The apparatus of claim 10, wherein said compensation signal DC component has an approximately zero value when said input signal DC component has a magnitude less than a predetermined value.

18. An apparatus including a transimpedance amplifier with controllable noise reduction, comprising:

first amplifier means for receiving an input signal and a compensation signal and in response thereto generating an output signal, wherein
  said input signal includes an AC component and a DC component,
  said compensation signal includes a DC component inverse in polarity to said input signal DC component,
  said output signal includes an AC component corresponding to said input signal AC component, and a DC component comprising a sum of first and second DC subcomponents, and
  said first DC subcomponent corresponds to said input signal DC component;
second amplifier means for receiving said output signal DC component and a reference signal and in response thereto generating a control signal, wherein
  said reference signal includes a DC component corresponding to a sum of said second DC subcomponent and a DC offset, and
  said control signal has a value related to a difference between said first DC subcomponent and said DC offset; and
signal generator means for receiving said control signal and in response thereto generating said compensation signal.

19. An apparatus including a transimpedance amplifier with controllable noise reduction, comprising:
  an input terminal to convey an input signal and a compensation signal, wherein
    said input signal includes an AC component and a DC component, and
    said compensation signal includes a DC component inverse in polarity to said input signal DC component;
  an output terminal to convey an output signal which includes an AC component corresponding to said input signal AC component, and a DC component comprising a sum of first and second DC subcomponents, wherein said first DC subcomponent corresponds to said input signal DC component;
  a reference terminal to convey a reference signal including a DC component corresponding to a sum of said second DC subcomponent and a DC offset;
  first amplifier circuitry coupled to said input and output terminals, and responsive to reception of said input and compensation signals by providing said output signal;
  second amplifier circuitry coupled to said output and reference terminals, and responsive to reception of said output signal DC component and said reference signal by providing a control signal; and
  signal generator circuitry coupled to said input terminal and said second amplifier circuitry, and responsive to reception of said control signal by providing said compensation signal, wherein said compensation signal DC component corresponds to a difference between said first DC subcomponent and said DC offset.

20. The apparatus of claim 19, wherein said first amplifier circuitry comprises a transimpedance amplifier.

21. The apparatus of claim 19, wherein said first amplifier circuitry comprises a differential amplifier and resistive circuitry coupled between said input and output terminals.

22. The apparatus of claim 19, wherein said second amplifier circuitry comprises signal comparison circuitry responsive to a comparison of said output signal DC component and said reference signal DC component by providing said control signal.

23. The apparatus of claim 19, wherein said signal generator circuitry comprises current source circuitry responsive to said control signal by providing a current as said compensation signal.

24. The apparatus of claim 19, wherein said control signal has a value related to a difference between said first DC subcomponent and said DC offset.

25. The apparatus of claim 19, wherein said DC offset corresponds to a minimum one of a plurality of values comprising a predetermined value related to said first DC subcomponent and a predetermined value related to said output signal AC component.

26. The apparatus of claim 19, wherein said compensation signal DC component has an approximately zero value when said input signal DC component has a magnitude less than a predetermined value.

27. An apparatus including a transimpedance amplifier with controllable noise reduction, comprising:
  first amplifier means for receiving an input signal and a compensation signal and in response thereto generating an output signal, wherein
    said input signal includes an AC component and a DC component,
    said compensation signal includes a DC component inverse in polarity to said input signal DC component,
    said output signal includes an AC component corresponding to said input signal AC component, and a DC component comprising a sum of first and second DC subcomponents, and
    said first DC subcomponent corresponds to said input signal DC component;
  second amplifier means for receiving said output signal DC component and a reference signal and in response thereto generating a control signal, wherein said reference signal includes a DC component corresponding to a sum of said second DC subcomponent and a DC offset; and
  signal generator means for receiving said control signal and in response thereto generating said compensation signal, wherein said compensation signal DC component corresponds to a difference between said first DC subcomponent and said DC offset.

* * * * *